(12) United States Patent
Matsumoto et al.

(10) Patent No.: US 11,754,353 B2
(45) Date of Patent: Sep. 12, 2023

(54) PROCESSING WATER SUPPLY SYSTEM

(71) Applicant: DISCO CORPORATION, Tokyo (JP)

(72) Inventors: Tadaomi Matsumoto, Tokyo (JP); Masaru Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 85 days.

(21) Appl. No.: 17/323,303

(22) Filed: May 18, 2021

(65) Prior Publication Data

US 2021/0381783 A1 Dec. 9, 2021

(30) Foreign Application Priority Data

Jun. 3, 2020 (JP) ................................. 2020-097018

(51) Int. Cl.
*F28F 27/02* (2006.01)
*F28F 17/00* (2006.01)

(52) U.S. Cl.
CPC .............. *F28F 27/02* (2013.01); *F28F 17/00* (2013.01); *F28F 2265/22* (2013.01)

(58) Field of Classification Search
CPC . H01L 21/02041; B23Q 11/14; B23Q 11/146; B23Q 11/141; F28F 27/02; F28F 17/00; F28F 2265/22
See application file for complete search history.

(56) References Cited

U.S. PATENT DOCUMENTS

| | | | | | |
|---|---|---|---|---|---|
| 4,637,454 | A | * | 1/1987 | Lowes | F28F 27/02 |
| | | | | | 165/280 |
| 6,148,626 | A | * | 11/2000 | Iwamoto | G03F 7/70858 |
| | | | | | 62/185 |
| 6,554,196 | B2 | * | 4/2003 | Sasayama | F25D 17/02 |
| | | | | | 236/78 D |
| 7,000,416 | B2 | * | 2/2006 | Hirooka | H01J 37/32724 |
| | | | | | 165/104.19 |
| 7,178,346 | B2 | * | 2/2007 | Huang | F25D 17/02 |
| | | | | | 62/81 |
| 7,604,042 | B2 | * | 10/2009 | Yamazaki | C23C 16/4401 |
| | | | | | 165/80.4 |
| 7,681,404 | B2 | * | 3/2010 | Bean, Jr. | H05K 7/20763 |
| | | | | | 361/699 |

(Continued)

FOREIGN PATENT DOCUMENTS

| | | | | |
|---|---|---|---|---|
| CN | 113280538 | A | * 8/2021 | .............. F16K 11/00 |
| DE | 3429965 | A | * 3/1985 | ........... B23Q 11/146 |

(Continued)

*Primary Examiner* — Jenna M Hopkins
(74) *Attorney, Agent, or Firm* — Greer Burns & Crain Ltd.

(57) ABSTRACT

A processing water supply system for supplying processing water to a processing apparatus includes a first heat exchanger that cools the processing water by heat of vaporization of a cooling medium, a second heat exchanger that cools the cooling medium compressed to reach a high temperature, a cooling water receiving route that receives the cooling water from cooling water supply equipment to the second heat exchanger, a cooling water drain route that drains the cooling water heat-exchanged by the second heat exchanger to reach a high temperature to drain equipment, and a bypass route that is disposed between the cooling water receiving route and the cooling water drain route and adjusts the cooling water reaching the high temperature at the second heat exchanger to a temperature permissible by the drain equipment.

3 Claims, 2 Drawing Sheets

(56) References Cited

U.S. PATENT DOCUMENTS

| | | | | |
|---|---|---|---|---|
| 10,371,469 | B2* | 8/2019 | Kawasuji | H05G 2/008 |
| 2001/0003347 | A1* | 6/2001 | Shimoda | F25D 17/02 |
| | | | | 236/13 |
| 2001/0037652 | A1* | 11/2001 | Sasayama | F25D 31/005 |
| | | | | 236/12.12 |
| 2006/0201172 | A1* | 9/2006 | Kaneko | F25D 17/02 |
| | | | | 62/185 |
| 2007/0272155 | A1* | 11/2007 | Nozawa | H01L 21/67248 |
| | | | | 118/724 |
| 2009/0118872 | A1* | 5/2009 | Nonaka | G05D 23/1934 |
| | | | | 700/285 |
| 2010/0206519 | A1* | 8/2010 | Cho | H01L 21/67248 |
| | | | | 165/104.19 |
| 2011/0154835 | A1* | 6/2011 | Miyamoto | B23Q 11/14 |
| | | | | 62/430 |
| 2013/0092553 | A1* | 4/2013 | Yamakawa | H01L 21/02041 |
| | | | | 205/471 |
| 2020/0117223 | A1* | 4/2020 | Kobayashi | F25B 41/20 |
| 2020/0309383 | A1* | 10/2020 | Miyazaki | F24D 3/08 |
| 2021/0381783 | A1* | 12/2021 | Matsumoto | F28F 17/00 |

FOREIGN PATENT DOCUMENTS

| | | | | | |
|---|---|---|---|---|---|
| DE | 102005004673 | A1 | * | 8/2006 | B23Q 11/0057 |
| EP | 1757404 | A1 | * | 2/2007 | B23Q 11/141 |
| EP | 3722719 | A1 | * | 10/2020 | B23Q 11/141 |
| JP | 2009202295 | A | | 9/2009 | |
| KR | 773474 | B1 | * | 11/2007 | H01L 21/67248 |
| WO | WO-2007073091 | A1 | * | 6/2007 | C23C 16/46 |
| WO | WO-2008082026 | A1 | * | 7/2008 | H01L 21/67248 |
| WO | WO-2009051288 | A1 | * | 4/2009 | H01L 21/67248 |

\* cited by examiner

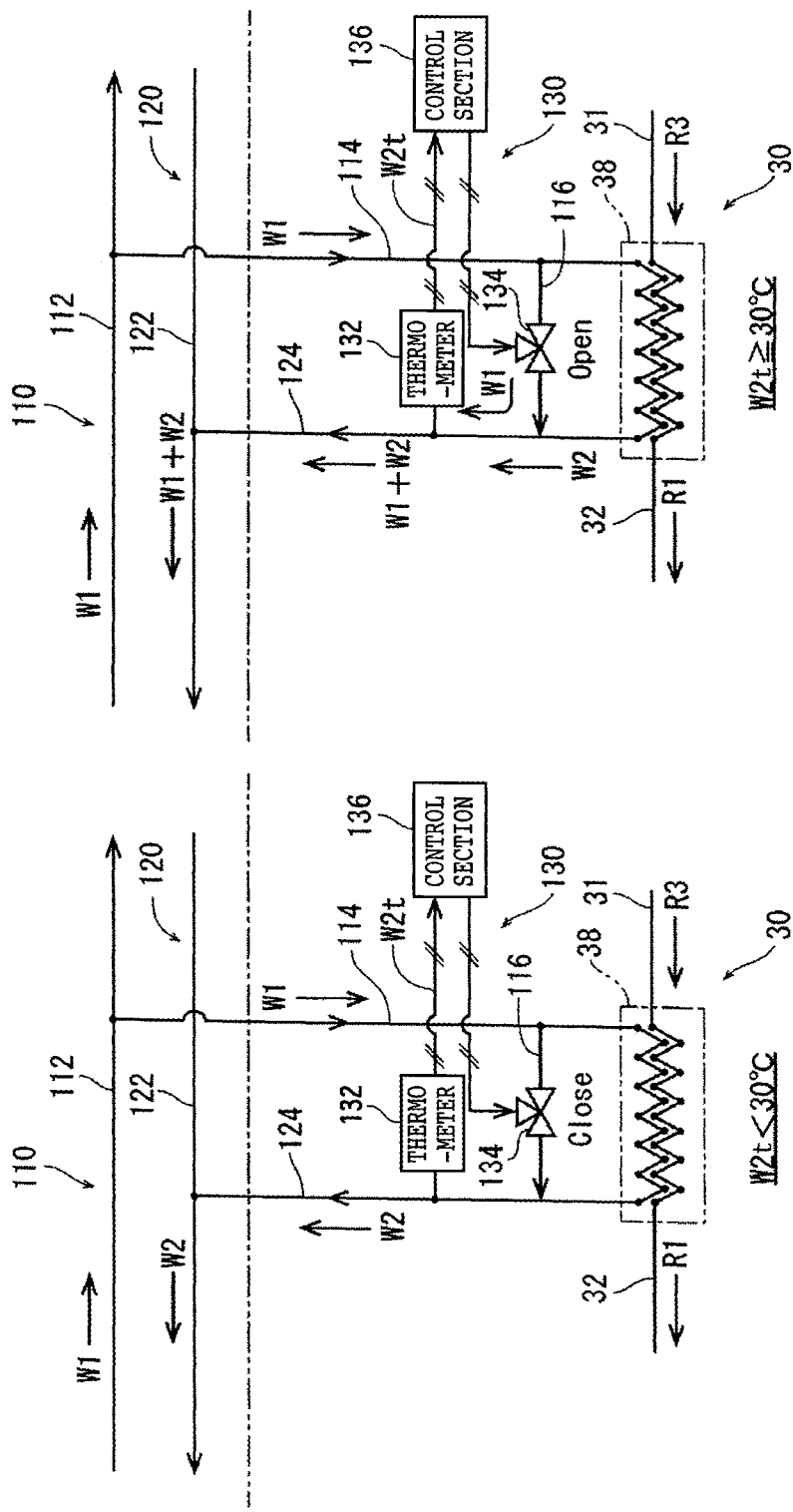

PROCESSING WATER SUPPLY SYSTEM

BACKGROUND OF THE INVENTION

Field of the Invention

The present invention relates to a processing water supply system for supplying processing water to a processing apparatus that processes a workpiece while supplying the processing water to the workpiece.

Description of the Related Art

A wafer formed on its front surface with a plurality of devices such as integrated circuits (ICs) and large scale integration (LSI) partitioned by a plurality of intersecting streets is divided into individual device chips by a dicing apparatus, and the thus divided device chips are utilized for electric apparatuses such as mobile phones and personal computers.

The dicing apparatus includes a chuck table that holds the wafer, a cutting unit including a cutting blade for cutting the wafer held by the chuck table while supplying processing water to the wafer, and a feeding mechanism that puts the chuck table and the cutting unit into relative processing feeding, and the dicing apparatus can divide the wafer into the individual device chips with high accuracy (see, for example, Japanese Patent Laid-open No. 2009-202295).

The processing water supplied to the cutting unit is controlled to a fixed temperature (for example, around 23° C.) by a temperature controller, whereby accuracy of cutting is maintained.

SUMMARY OF THE INVENTION

A plant in which the aforementioned dicing apparatus is installed is provided with cooling water supply equipment that supplies the plant with cooling water controlled to a predetermined low temperature (for example, 15° C.) and used for cooling of the apparatus, cleaning, and the like, and drain equipment for draining the cooling water having been used in the equipment in the plant. Here, for the drain water let flow to the drain equipment, an upper limit (for example, 30° C.) for permissible temperature is provided. In the case where, when the cooling water having been used for cooling the processing water in the aforementioned temperature controller is drained to the drain equipment, the cooling water exceeds the upper limit temperature and is, for example, 40° C. to 60° C., there is a problem that the cooling water cannot be drained to the drain equipment.

Accordingly, it is an object of the present invention to provide a processing water supply system by which it is ensured that, even in the case where an upper limit is provided for the temperature of cooling water when the cooling water is drained to drain equipment and where the cooling water is used for cooling of processing water used in a processing apparatus and the cooling water reaches a high temperature in excess of the upper limit temperature, the cooling water can be adjusted to a temperature permissible by the drain equipment.

In accordance with an aspect of the present invention, there is provided a processing water supply system for supplying processing water to a processing apparatus. The processing water supply system includes a first heat exchanger that cools the processing water by heat of vaporization of a cooling medium, a second heat exchanger that cools the cooling medium compressed to reach a high temperature, a cooling water receiving route that is connected to the second heat exchanger and receives cooling water from cooling water supply equipment to the second heat exchanger, a cooling water drain route that is connected to the second heat exchanger and discharges the cooling water heat-exchanged in the second heat exchanger to reach a high temperature to drain equipment, and a bypass route that is disposed between the cooling water receiving route and the cooling water drain route and adjusts the cooling water reaching the high temperature to a temperature permissible by the drain equipment.

Preferably, the processing water supply system further includes a thermometer disposed in the cooling water drain route between the bypass route and the drain equipment, a flow rate adjusting valve disposed in the bypass route, and a control section that controls the flow rate adjusting valve according to a temperature detected by the thermometer. The control section controls the flow rate adjusting valve such that a value of the thermometer becomes a temperature permissible by the drain equipment.

According to the present invention, it is ensured that when the cooling water used in the processing water supply system is drained to the drain equipment, the cooling water can be adjusted to a temperature permissible by the drain equipment, whereby a problem that the temperature of the cooling water drained is so high as to exceed the permissible temperature in the drain equipment is solved.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2A is a block diagram depicting, in an enlarged form, flow rate adjusting means in the case where the temperature of cooling water drained to drain equipment is less than a permissible temperature; and FIG. 2B is a block diagram depicting, in an enlarged form, the flow rate adjusting means in the case where the temperature of the cooling water drained to the drain equipment is equal to or higher than the permissible temperature.

DETAILED DESCRIPTION OF THE PREFERRED EMBODIMENT

Figure 1:
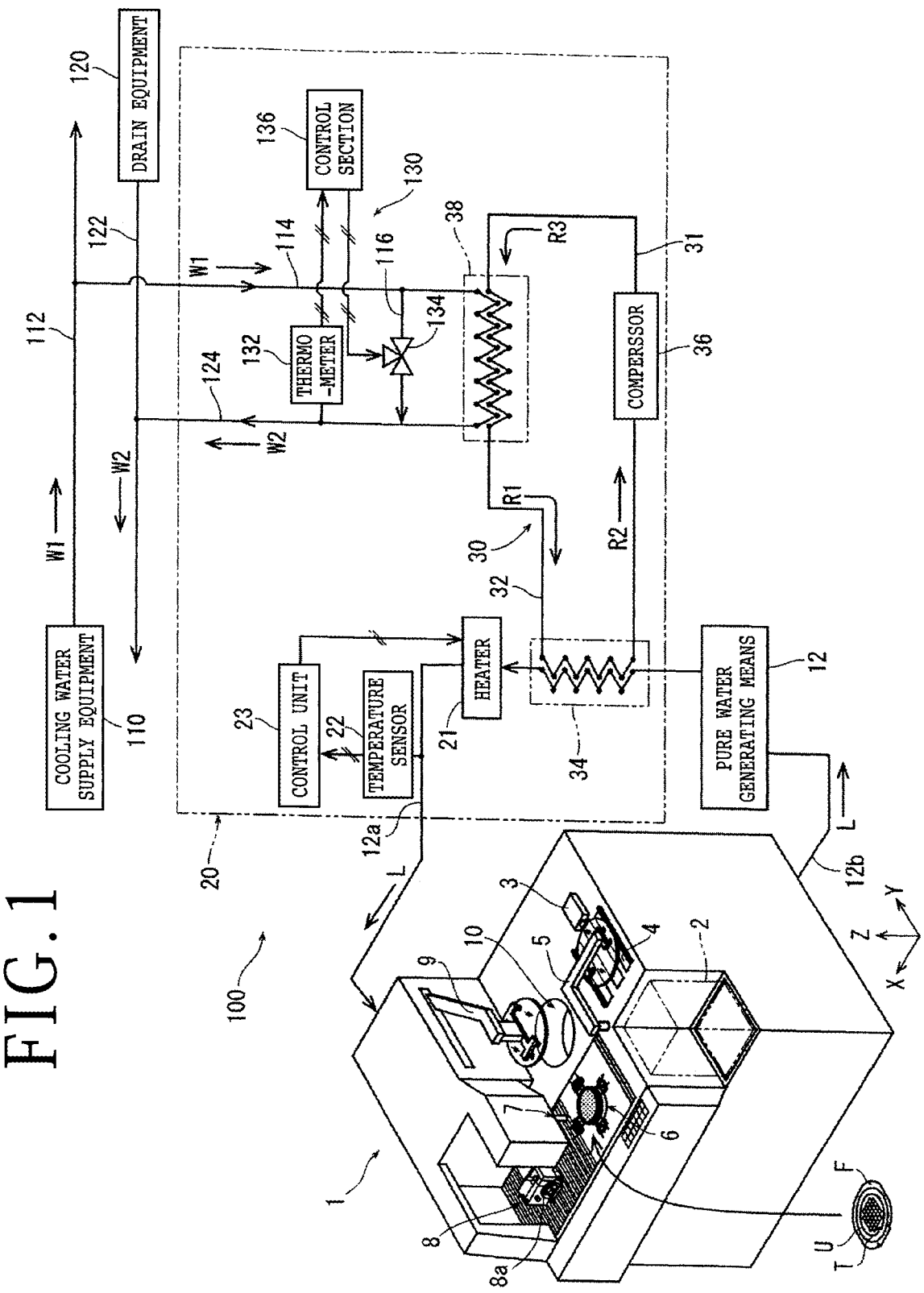
FIG. 1 is a general perspective view of a cutting apparatus and a block diagram depicting a processing water supply system connected to the cutting apparatus.

A processing water supply system according to an embodiment of the present invention will be described in detail below referring to the attached drawings. FIG. 1 illustrates a processing water supply system 100 according to the present embodiment and a cutting apparatus 1 disposed as a processing apparatus to which the processing water supply system 100 is applied.

A workpiece to be processed by the cutting apparatus 1 is a wafer U held by an annular frame F through an adhesive tape T. The cutting apparatus 1 includes at least a chuck table 6 that holds the wafer U, and a cutting unit 8 as a processing unit that cuts the wafer U while supplying processing water to the wafer U. A plurality of the wafers U are accommodated in a cassette 2 (indicated by long and two short dashes line) and are each conveyed into the cutting apparatus 1.

The wafers U accommodated in the cassette 2 each have the frame F gripped by a conveying-in/out unit 3 and moved in a Y-axis direction indicated by an arrow Y in the figure, to be conveyed onto a temporary placing table 4. The wafer U conveyed onto the temporary placing table 4 is attracted under suction by a conveying unit 5, and, by a slewing operation of the conveying unit 5, is conveyed to and placed on the chuck table 6 positioned in a conveying-in/out region for conveying the wafer U in and out, and is held under suction by the chuck table 6. The chuck table 6 is put into processing feeding in an X-axis direction indicated by an arrow X in the figure by an X-axis moving mechanism. In a moving direction in the X-axis direction of the chuck table 6, an alignment unit 7 including an imaging unit and the cutting unit 8 are disposed. The cutting unit 8 includes a Y-axis moving mechanism (omitted from illustration) for putting a cutting blade 8a into indexing feeding in the Y-axis direction, and a Z-axis moving mechanism (omitted from illustration) for lifting the cutting blade 8a up and down in a Z-axis direction indicated by an arrow Z and putting the cutting blade 8a into cutting feeding. The wafer U held by the chuck table 6 is moved in the X-axis direction by the X-axis moving mechanism, and is positioned directly under the alignment unit 7. The wafer U is imaged by the alignment unit 7, whereby a street to be cut of the wafer U is detected.

After the street is detected and alignment between the street and the cutting blade 8a of the cutting unit 8 is conducted by the alignment unit 7, the chuck table 6 is moved in the X-axis direction, whereby a predetermined street extending in a first direction is positioned directly under the cutting blade 8a of the cutting unit 8 (processing area). Next, the cutting blade 8a is rotated, is lowered and put into cutting feeding by the Z-axis moving mechanism, processing water L supplied from the processing water supply system 100 is supplied to the cutting position through the cutting unit 8, and the chuck table 6 is put into processing feeding in the X-axis direction, to cut the predetermined street extending in the first direction. After the predetermined street is cut, the cutting blade 8a is raised, the Y-axis feeding mechanism is operated to put the cutting blade 8a into indexing feeding by a spacing between the streets adjacent to each other in the Y-axis direction, and the street extending in the first direction is cut similarly to the above-mentioned. This is repeated to cut all the streets extending in the first direction, after which the chuck table 6 is rotated by 90 degrees, and the street extending in a second direction orthogonal to the street extending in the first direction is matched to the X-axis direction.

Next, the street extending in the second direction that is matched to the X-axis direction is cut similarly to the above-mentioned cutting, and all the streets of the wafer U are cut, whereby the wafer U is divided into individual device chips. The wafer U divided into the individual device chips by the cutting is sucked and conveyed out by a conveying unit 9 from the chuck table 6, which is moved from the processing area to the conveying-in/out area, and is conveyed to the cleaning apparatus 10 (details are omitted). The wafer U cleaned and dried by the cleaning apparatus 10 is conveyed out from the cleaning apparatus 10 and conveyed onto the temporary placing table 4 by the conveying unit 5, and is accommodated into the cassette 2 by an action of the conveying-in/out unit 3, whereby cutting of the wafer U is completed.

The processing water L supplied from the aforementioned cutting unit 8 to the cutting position is supplied from a processing water supply passage 12a of the processing water supply system 100 depicted in FIG. 1 to the cutting apparatus 1, and the processing water L used for cutting is recovered through a processing water drain passage 12b. Referring to FIG. 1, the processing water supply system 100 will be described.

The processing water supply system 100 includes a temperature controller 20. The temperature controller 20 includes a first heat exchanger 34 that cools the processing water L flowing through the processing water supply passage 12a and the processing water drain passage 12b by heat of vaporization of a cooling medium R1, and a second heat exchanger 38 that cools a cooling medium R3 compressed and reaching a high temperature. In addition, the second heat exchanger 38 includes a cooling water receiving route 114 that receives cooling water W1 flowing through a cooling water pipe 112 of cooling water supply equipment 110, and a cooling water drain route 124 that drains a cooling water W2, heat-exchanged by the second heat exchanger 38 and reaching a high temperature, to a drain pipe 122 of drain equipment 120. Further, a bypass route 116 that adjusts the cooling water W2 reaching the high temperature to a temperature (for example, below 30° C.) permissible by the drain equipment 120 is disposed between the cooling water receiving route 114 and the cooling water drain route 124. Pure water generating means 12 is disposed in the processing water drain passage 12b in the present embodiment. The pure water generating means 12 includes a filter, ion exchange means, UV ray applying means, a precision filter, and the like (all of them are omitted from illustration). Note that the pure water generating means 12 may be replaced by only a filter, and this is not limitative.

The aforementioned cooling water supply equipment 110 is equipment which is disposed in a plant in which the cutting apparatus 1 is installed, and supplies the cooling water W1 controlled to a fixed temperature (for example, 15° C.) to a plurality of processing apparatuses (omitted from illustration) including the cutting apparatus 1 through the cooling water pipe 112. In addition, the drain equipment 120 is equipment that recovers the cooling water W2 used in the plurality of processing apparatuses including the cutting apparatus 1 illustrated through the drain pipe 122. The cooling water W2 recovered by the drain pipe 122 is subjected to a predetermined cleaning treatment and then drained to the exterior, or is subjected to a predetermined cleaning treatment and temperature adjustment and then recirculated to the cooling water supply equipment 110 to be reused as the cooling water W1.

Flow rate adjusting means 130 is disposed in the processing water supply system 100 in the present embodiment. The flow rate adjusting means 130 includes the bypass route 116 connecting between the cooling water receiving route 114 and the cooling water drain route 124, a thermometer 132 disposed in the cooling water drain route 124 between the bypass route 116 and the drain pipe 122 of the drain equipment 120, a flow rate adjusting valve 134 disposed in the bypass route 116, and a control section 136. The control section 136 controls the flow rate adjusting valve 134 such that the value of the temperature of the cooling water W2 detected by the thermometer 132 becomes a temperature (for example, below 30° C.) permissible by the drain equipment 120.

A heater 21, a temperature sensor 22, and a control unit 23 are disposed as required in the processing water supply passage 12a for supplying processing water L from the first heat exchanger 34 to the cutting apparatus 1. The cooling water L cooled to below 23° C. by the first heat exchanger 34 is adjusted by the heater 21 operated based on the temperature detected by the temperature sensor 22, is controlled to a predetermined temperature (for example, 23° C.), and is supplied to the cutting apparatus 1.

The first heat exchanger 34 and the second heat exchanger 38 constitute a refrigeration cycle 30 depicted in FIG. 1. The refrigeration cycle 30 includes coolant passages 31 and 32 accommodating a cooling medium therein, and the first heat exchanger 34 and the second heat exchanger 38 are connected by the coolant passages 31 and 32. A compressor 36 is disposed between the first heat exchanger 34 and the second heat exchanger 38, and the cooling medium R3 compressed by the compressor 36 and turned into a gas of high temperature and high pressure is sent to the second heat exchanger 38. In the second heat exchanger 38, heat exchange is performed between the cooling water W1 supplied through the cooling water receiving route 114 of the cooling water supply equipment 110 and the cooling medium R3, whereby the cooling medium R3 is cooled to be the liquid cooling medium R1. The cooling medium R1 becoming the liquid in the second heat exchanger 38 passes through an expansion valve (omitted from illustration) disposed in the coolant passage 32 on the downstream side of the second heat exchanger 38, is sent to the first heat exchanger 34, and cools the processing water L passing through the first heat exchanger 34 by the action of heat of vaporization of the cooling medium R1 evaporated in the first heat exchanger 34. The cooling medium R2 having passed through the first heat exchanger 34 to become the low temperature gas is compressed by the compressor 36, to be again the cooling medium R3 of high temperature and high pressure, which is sent to the second heat exchanger 38.

The processing water supply system 100 according to the present embodiment generally has the configuration as described above, and while referring to FIGS. 2A and 2B depicting, in an enlarged form, the flow rate adjusting means 130 depicted in FIG. 1, in addition to FIG. 1, the function and action thereof will be described below.

When the cutting apparatus 1 is operated to cut the wafer U, the processing water supply system 100 is also started operating. Here, a temperature W2t of the cooling water W2 passing through the cooling water drain route 124 is detected by the thermometer 132 disposed in the cooling water drain route 124, and is sent to the control section 136. In the case where the temperature W2t is below 30° C., the temperature is within a range of temperature permissible in the drain equipment 120, so that a control signal is sent from the control section 136 such that the state of the flow rate adjusting valve 134 disposed in the bypass route 116 becomes "Closed." Therefore, for the drain equipment 120, heat exchange with the cooling medium R3 is performed in the second heat exchanger 38, and the cooling water W2 raised in temperature within the range of below 30° C. is made to flow as it is through the drain pipe 122 of the drain equipment 120.

On the other hand, as depicted in FIG. 2B, when the temperature W2t of the cooling water W2 sent to the control section 136 that is detected by the thermometer 132 disposed in the cooling water drain route 124 is equal to or above 30° C., the temperature is not within the range of temperature permissible in the drain equipment 120, so that a control signal is sent from the control section 136 to the flow rate adjusting valve 134 such that the state of the flow rate adjusting valve 134 becomes "Open." As a result, the cooling water W1 at 15° C. is introduced into the cooling water drain route 124 in a predetermined proportion, and is mixed with the cooling water W2 flowing through the cooling water drain route 124, whereby temperature adjustment to below 30° C. is conducted, and the cooling water is let flow into the drain pipe 122 of the drain equipment 120. Note that the opening degree at the time of putting the flow rate adjusting valve 134 into the "Open" state can be varied according to the temperature W2t of the cooling water W2 detected. The opening degree of the flow rate adjusting valve 134 is enlarged in the case where the temperature W2t is high (for example, 60° C.), and is reduced in the case where the temperature W2t is low. In addition, even in the case where the flow rate adjusting valve 134 is in the "Closed" state and where a reference temperature of the temperature W2t for putting the flow rate adjusting valve 134 into the "Open" state is equal to or above 30° C., it is preferable that a reference temperature of the temperature W2t for turning the flow rate adjusting valve 134 from the "Open" state into the "Closed" state is set to a value below 30° C. (for example, equal to or below 25° C.) so as to prevent control hunting.

Note that while the flow rate adjusting means 130 is disposed and opening and closing of the flow rate adjusting valve 134 is controlled based on the temperature detected by the thermometer 132 in the above-described embodiment, this is not limitative of the present invention. In the case where the temperature W2t of the cooling water W2 raised by the second heat exchanger 38 can be easily estimated, a predetermined quantity of the cooling water W1 may be introduced into the cooling water drain route 124 through the bypass route 116 from which the flow rate adjusting means 130 has been eliminated. More specifically, a venturi tube may be provided at a connection part between the bypass route 116 and the cooling water drain route 124, and the cooling water W1 according to the flow rate of the high-temperature cooling water W2 flowing through the cooling water drain route 124 may be mixed with the latter.

In addition, while the cutting apparatus 1 has been mentioned as the processing apparatus to which the processing water supply system 100 of the present invention is applied in the above-described embodiment, this is not limitative of the present invention. Any processing apparatus is applicable insofar as the processing apparatus includes a processing unit that processes a workpiece held by a chuck table while supplying processing water to the workpiece. For example, a grinding apparatus and a polishing apparatus are applicable.

According to the present embodiment, at the time of draining the cooling water W2 used in the processing water supply system 100 and reaching a high temperature to the drain equipment 120, the cooling water W2 can be adjusted to a temperature permissible in the drain equipment 120, so that the problem that the temperature of the cooling water W2 is so high (40° C. to 60° C.) to exceed the permissible temperature (30° C.) of the drain equipment 120 is solved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing water supply system for supplying processing water to a processing apparatus, the processing water supply system comprising:
   a first heat exchanger that cools the processing water by heat of vaporization of a cooling medium;
   a compressor which compresses the cooling medium;
   a second heat exchanger that cools the cooling medium;

a cooling water receiving route that is connected to the second heat exchanger and receives cooling water from cooling water supply equipment to the second heat exchanger;

a cooling water drain route that is connected to the second heat exchanger and discharges the cooling water heat-exchanged in the second heat exchanger to drain equipment;

a bypass route that is disposed between the cooling water receiving route and the cooling water drain route, wherein the bypass route supplies a portion of the cooling water to the cooling water drain route without passing through the second heat exchanger when the cooling water heat-exchanged in the second heat exchanger exceeds a preset temperature, wherein a remainder of the cooling water flows through the second heat exchanger; and a flow rate adjusting valve disposed between an inlet and an outlet of the bypass route, wherein the flow rate adjusting valve adjusts the flow rate of the cooling water through the bypass route.

2. The processing water supply system according to claim 1, further comprising:

a thermometer disposed in the cooling water drain route between the bypass route and the drain equipment; and wherein the flow rate adjusting valve adjusts the flow rate of the cooling water through the bypass route based on the temperature detected by the thermometer such that a value of the thermometer becomes a temperature permissible by the drain equipment.

3. The processing water supply system according to claim 1, wherein the compressor increases the pressure and temperature of the cooling medium.

* * * * *